United States Patent
Kubo et al.

(10) Patent No.: US 10,181,559 B2
(45) Date of Patent: Jan. 15, 2019

(54) ETCHING METHOD

(71) Applicant: TOKYO ELECTRON LIMITED, Tokyo (JP)

(72) Inventors: Takuya Kubo, Tokyo (JP); Song yun Kang, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/841,998

(22) Filed: Dec. 14, 2017

(65) Prior Publication Data

US 2018/0182957 A1 Jun. 28, 2018

(30) Foreign Application Priority Data

Dec. 22, 2016 (JP) .................. 2016-249474

(51) Int. Cl.
*H01L 43/12* (2006.01)
*H01L 21/02* (2006.01)
*H01L 43/10* (2006.01)

(52) U.S. Cl.
CPC ........ *H01L 43/12* (2013.01); *H01L 21/02252* (2013.01); *H01L 43/10* (2013.01)

(58) Field of Classification Search
None
See application file for complete search history.

(56) References Cited

U.S. PATENT DOCUMENTS

| | | | | |
|---|---|---|---|---|
| 6,509,141 | B2* | 1/2003 | Mullee | G03F 7/422 134/1 |
| 2005/0032248 | A1* | 2/2005 | Cyrille | G11B 5/3906 438/3 |
| 2014/0141532 | A1* | 5/2014 | Nishimura | H01L 43/12 438/3 |
| 2017/0148979 | A1* | 5/2017 | Kim | H01L 27/228 |

FOREIGN PATENT DOCUMENTS

| JP | 2011-14881 A | 1/2011 |
|---|---|---|
| JP | 2014-130946 A | 7/2014 |
| JP | 2015-122473 A | 7/2015 |
| JP | 2016-046470 A | 4/2016 |
| JP | 2016-164955 A | 9/2016 |

* cited by examiner

*Primary Examiner* — Khaja Ahmad
(74) *Attorney, Agent, or Firm* — Nath, Goldberg & Meyer; Jerald L. Meyer

(57) ABSTRACT

There is provided an workpiece etching method executed in manufacturing a magneto-resistive effect element, the workpiece including first and second multilayer films, the first multilayer film including first and second magnetic layers and a tunnel barrier layer formed between the first and second magnetic layers, and the second multilayer film being a multilayer film constituting a pinning layer in the magneto-resistive effect element. The method includes: etching the first multilayer film; generating plasma of a first gas including hydrocarbon and noble gases inside a chamber of a plasma processing apparatus to etch the second multilayer film inside the chamber; and generating plasma of a second gas including gas containing carbon and oxygen, an oxygen gas and a noble gas and not containing hydrogen (Continued)

inside the chamber to remove a carbon-containing deposit formed on the workpiece in the generating the plasma of the first gas.

10 Claims, 10 Drawing Sheets

ETCHING METHOD

CROSS-REFERENCE TO RELATED APPLICATION

This application is based upon and claims the benefit of priority from Japanese Patent Application No. 2016-249474, filed on Dec. 22, 2016, the entire contents of which are incorporated herein by reference.

TECHNICAL FIELD

Embodiments of the present disclosure relate to a workpiece etching method executed in manufacturing a magneto-resistive effect element.

BACKGROUND

A magneto-resistive effect element including a magnetic tunnel junction (MTJ) is used in a device such as, for example, a MRAM (Magneto-resistive Random Access Memory) or the like.

When manufacturing a magneto-resistive effect element, a multilayer film is etched. In the etching performed to manufacture the magneto-resistive effect element, plasma of a hydrocarbon gas and an inert gas is generated inside a chamber of a plasma processing apparatus. Ions and radicals generated from the plasma are irradiated to the multilayer film. Thus, the multilayer film is etched. In such etching, a nitrogen gas and a noble gas are used as the inert gas.

When the plasma of the hydrocarbon gas is generated to etch the multilayer film, deposits are formed on the workpiece including the multilayer film. The amount of the deposits should be reduced. As an etching method that makes it possible to reduce the amount of deposits, it is conceivable to use an etching method that alternately performs a step of generating plasma of a hydrocarbon gas and a noble gas for etching of a multilayer film inside a chamber and a step of generating plasma of a hydrogen gas and a nitrogen gas for removing deposits. However, this etching method requires further improvement in suppressing deterioration of magnetic characteristics of a magneto-resistive effect element.

SUMMARY

Some embodiments of the present disclosure provide an etching method capable of suppressing deterioration of magnetic characteristics of a magneto-resistive effect element.

According to one embodiment of the present disclosure, there is provided an etching method of a workpiece executed in manufacturing a magneto-resistive effect element, wherein the workpiece includes a first multilayer film and a second multilayer film laminated with the first multilayer film, the first multilayer film includes a first magnetic layer, a second magnetic layer and a tunnel barrier layer formed between the first magnetic layer and the second magnetic layer, and the second multilayer film is a multilayer film constituting a pinning layer in the magneto-resistive effect element. The etching method includes: etching the first multilayer film; generating a plasma of a first gas including a hydrocarbon gas and a noble gas inside a chamber of a plasma processing apparatus to etch the second multilayer film inside the chamber of the plasma processing apparatus; and generating a plasma of a second gas including a gas containing carbon and oxygen, an oxygen gas and a noble gas and not containing hydrogen inside the chamber to remove a carbon-containing deposit formed on the workpiece in the generating a plasma of a first gas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
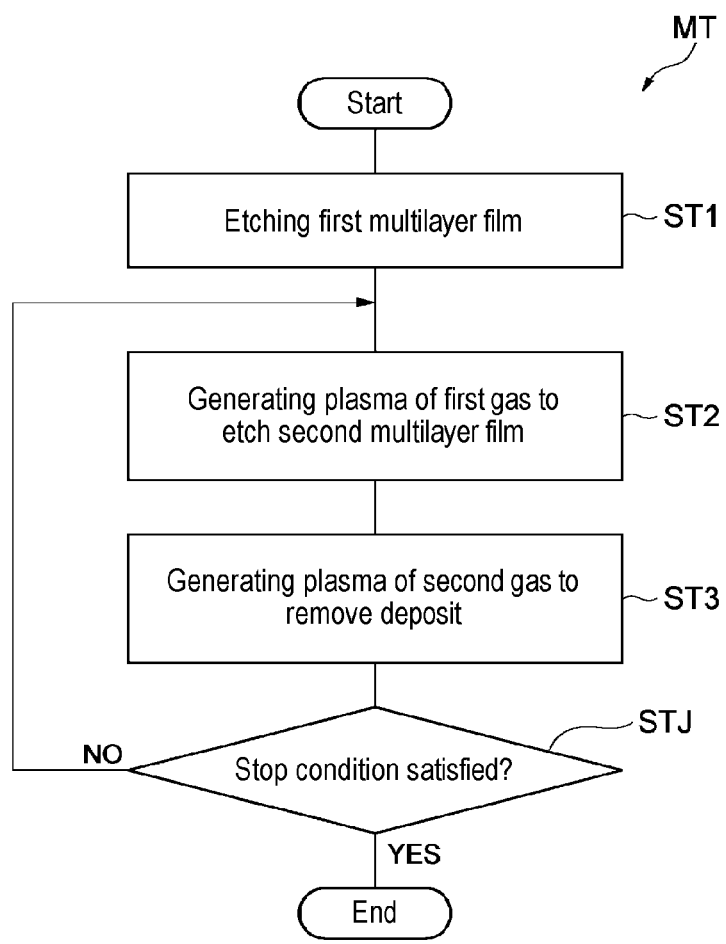
FIG. 1 is a flowchart showing an etching method according to an embodiment.

Hereinafter, various embodiments will be described in detail with reference to the drawings. In the drawings, the same reference numerals are given to the same or corresponding parts. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a flowchart showing an etching method according to an embodiment. The etching method MT (hereinafter referred to as "method MT") shown in FIG. 1 is a method of etching a workpiece and is executed in the manufacture of a magneto-resistive effect element.

Figure 2:
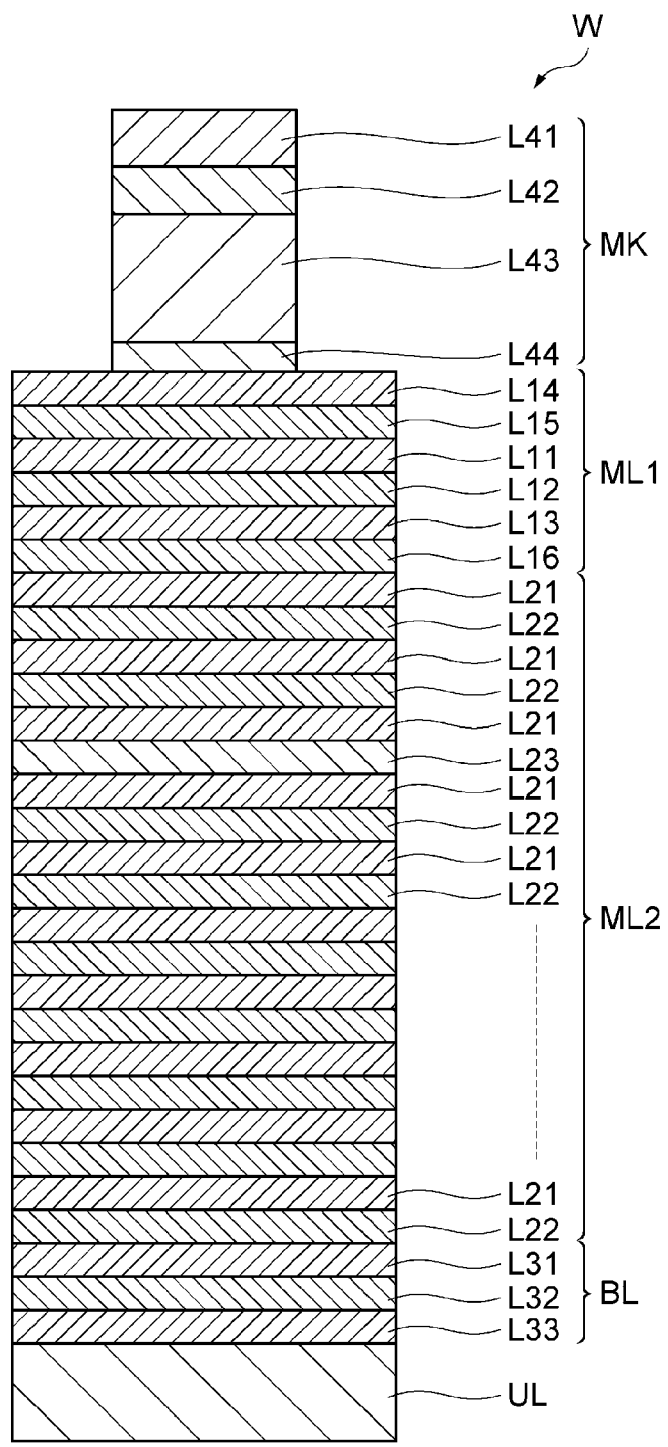
FIG. 2 is a partially enlarged sectional view showing an example of a workpiece.

FIG. 2 is a partially enlarged sectional view showing an example of a workpiece. The method MT may be applied to, for example, a workpiece W shown in FIG. 2. As shown in FIG. 2, the workpiece W includes a multilayer film ML1 (a first multilayer film) and a multilayer film ML2 (a second multilayer film). The multilayer film ML1 includes a first magnetic layer L11, a tunnel barrier layer L12 and a second magnetic layer L13. The tunnel barrier layer L12 is formed between the first magnetic layer L11 and the second magnetic layer L13. The first magnetic layer L11, the tunnel barrier layer L12 and the second magnetic layer L13 form a magnetic tunnel junction in a magneto-resistive effect element. The first magnetic layer L11 and the second magnetic layer L13 are, for example, CoFeB layers. The tunnel barrier layer L12 is an insulating layer formed from a metal oxide. The tunnel barrier layer L12 is, for example, a magnesium oxide layer (MgO layer).

In one example, the multilayer film ML1 further includes a cap layer L14, an upper layer L15 and a lower layer L16. The first magnetic layer L11, the tunnel barrier layer L12 and the second magnetic layer L13 are formed between the upper layer L15 and the lower layer L16. The upper layer L15 and the lower layer L16 are made of, for example, tungsten (W). The cap layer L14 is formed on the upper layer L15. The cap layer L14 is made of, for example, tantalum (Ta).

The multilayer film ML2 is laminated with the multilayer film ML1. The multilayer film ML2 is a metal multilayer film and is a multilayer film that constitutes a pinning layer in a magneto-resistive effect element. In one example, the multilayer film ML2 includes a plurality of cobalt layers L21 and a plurality of platinum layers L22. The plurality of cobalt layers L21 and the plurality of platinum layers L22 are alternately laminated one above another. In addition, the multilayer film ML2 may further include a ruthenium (Ru) layer L23. The ruthenium layer L23 is formed in the middle of the alternate laminated body of the cobalt layers L21 and the platinum layers L22.

The multilayer film ML1 and the multilayer film ML2 are formed on a base layer UL via a lower electrode layer BL. The base layer UL is formed of, for example, silicon oxide. In one example, the lower electrode layer BL includes a first layer L31, a second layer L32 and a third layer L33. The third layer L33 is a Ta layer and is formed on the base layer UL. The second layer L32 is a Ru layer and is formed on the third layer L33. The first layer L31 is a Ta layer and is formed on the second layer L32.

On the laminated body including the multilayer film ML1 and the multilayer film ML2, a mask MK is formed. The mask MK may be a single layer. However, in the example shown in FIG. 2, the mask MK is a laminated body. In the example shown in FIG. 2, the mask MK includes layers L41 to L44. The layer L41 is formed of silicon oxide, the layer L42 is formed of silicon nitride, the layer L43 is formed of titanium nitride (TiN), and the layer L44 is formed of ruthenium.

Figure 3:
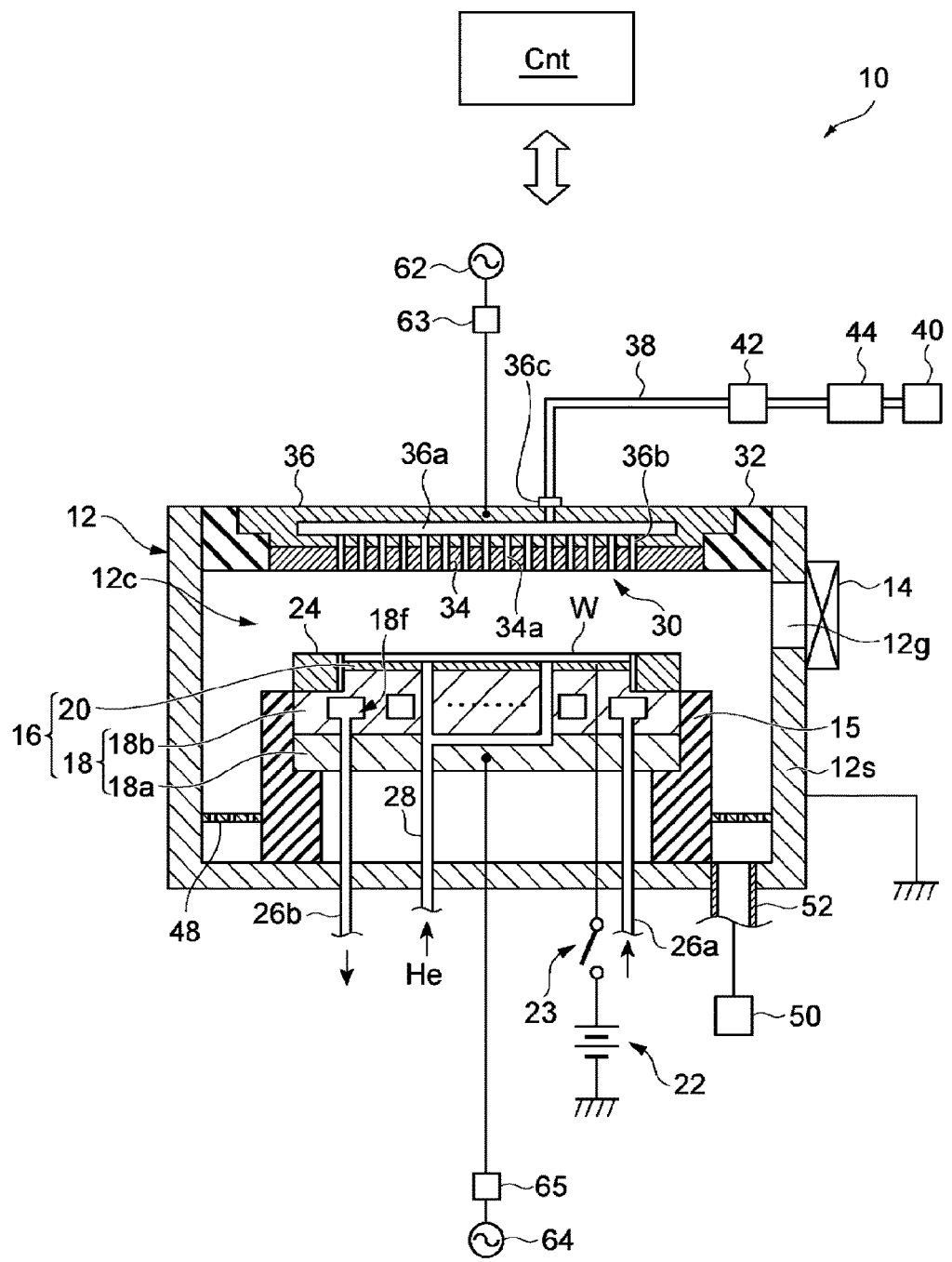
FIG. 3 is a view schematically showing a plasma processing apparatus that can be used to execute the method shown in FIG. 1.

Hereinafter, the method MT will be described by taking, as an example, a case where the method MT is applied to the workpiece W shown in FIG. 2. In the method MT, a plasma processing apparatus is used to etch the multilayer film ML1 and the multilayer film ML2 of the workpiece W. FIG. 3 is a view schematically showing a plasma processing apparatus that can be used to execute the method shown in FIG. 1. In FIG. 3, there is schematically shown a structure of a vertical cross section of the plasma processing apparatus. The plasma processing apparatus 10 shown in FIG. 3 is a capacitively coupled plasma processing apparatus.

The plasma processing apparatus 10 includes a chamber body 12. The chamber body 12 has a substantially cylindrical shape. The chamber body 12 provides its internal space as a chamber 12c. The chamber body 12 is made of, for example, aluminum. A film having a plasma resistance is formed on an inner wall surface of the chamber body 12, i.e., a wall surface defining the chamber 12c. This film may be a film formed by an anodizing treatment or a film made of ceramics, such as a film formed of yttrium oxide or the like. An opening 12g for transferring the workpiece W therethrough is formed on the side wall 12s of the chamber body 12. The opening 12g can be opened and closed by a gate valve 14. The chamber body 12 is connected to a ground potential.

Inside the chamber 12c, a support portion 15 extends upward from the bottom portion of the chamber body 12. The support portion 15 has a substantially cylindrical shape and is made of an insulating material such as quartz or the like. A stage 16 is provided inside the chamber 12c. The stage 16 is configured to support the workpiece W mounted thereon. The workpiece W may have a disc shape like a wafer. The stage 16 includes a lower electrode 18 and an electrostatic chuck 20. The stage 16 is supported by the support portion 15.

The lower electrode 18 includes a first plate 18a and a second plate 18b. The first plate 18a and the second plate 18b are made of a metal such as, for example, aluminum or the like and have a substantially disc shape. The second plate 18b is formed on the first plate 18a and is electrically connected to the first plate 18a.

On the second plate 18b, an electrostatic chuck 20 is provided. The electrostatic chuck 20 has an insulating layer and an electrode built in the insulating layer. A DC power source 22 is electrically connected to the electrode of the electrostatic chuck 20 via a switch 23. When a DC voltage from the DC power source 22 is applied to the electrode of the electrostatic chuck 20, the electrostatic chuck 20 generates an electrostatic force such as a Coulomb force or the like. The electrostatic chuck 20 attracts the workpiece W toward the electrostatic chuck 20 by virtue of the electrostatic force and holds the workpiece W.

A focus ring 24 is disposed on a peripheral edge portion of the second plate 18b so as to surround the edge of the workpiece W and the electrostatic chuck 20. The focus ring 24 is provided to improve the uniformity of plasma process. The focus ring 24 is made of a material appropriately selected according to the plasma process and may be formed of quartz, for example.

A flow path 18f is provided inside the second plate 18b. A coolant is supplied to the flow path 18f from a chiller unit provided outside the chamber body 12 via a pipe 26a. The coolant supplied to the flow path 18f is returned to the chiller unit via a pipe 26b. In this manner, the coolant is supplied to the flow path 18f so as to circulate through the flow path 18f. By controlling a temperature of the coolant with the chiller unit, a temperature of the workpiece W supported by the electrostatic chuck 20 is controlled.

Further, the plasma processing apparatus 10 includes a gas supply line 28. The gas supply line 28 supplies a heat transfer gas, for example, a He gas, provided from a heat transfer gas supply mechanism between the upper surface of the electrostatic chuck 20 and the back surface of the workpiece W.

The plasma processing apparatus 10 further includes an upper electrode 30. The upper electrode 30 is provided above the stage 16 and is provided substantially parallel to the lower electrode 18. The upper electrode 30 closes the upper opening of the chamber body 12 together with a member 32. The member 32 has insulating properties. The upper electrode 30 is supported on the upper portion of the chamber body 12 via the member 32.

The upper electrode 30 includes a top plate 34 and a support body 36. The top plate 34 faces the chamber 12c. The top plate 34 is provided with a plurality of gas discharge holes 34a. The top plate 34 is made of, but is not limited to, for example, silicon. Alternatively, the top plate 34 may have a structure in which a plasma resistant film is formed on the surface of a base material made of aluminum. This film may be a film formed by an anodizing treatment or a ceramic-made film such as a film formed from yttrium oxide or the like.

The support body 36 is configured to detachably support the top plate 34 and may be made of a conductive material such as aluminum, for example. A gas diffusion chamber 36a is provided inside the support body 36. A plurality of gas holes 36b extend downward from the gas diffusion chamber 36a. The gas holes 36b communicate with a plurality of gas discharge holes 34a, respectively. In addition, a gas introduction port 36c for guiding a gas to the gas diffusion chamber 36a is formed in the support body 36. A gas supply pipe 38 is connected to the gas introduction port 36c.

A gas source group 40 is connected to the gas supply pipe 38 via a valve group 42 and a flow rate controller group 44. The gas source group 40 includes a plurality of gas sources. The gas sources include a source of one or more noble gases, a source of a hydrocarbon gas, a source of a gas containing carbon and oxygen, and a source of an oxygen ($O_2$) gas. The gas sources may include a source of a Ne gas and a source of a Kr gas as the source of one or more noble gases. The hydrocarbon gas is, for example, a methane gas. The gas containing carbon and oxygen is a carbon monoxide gas and/or a carbon dioxide gas.

The valve group 42 includes a plurality of valves, and the flow rate control group 44 includes a plurality of flow rate controllers such as mass flow controllers or the like. The gas sources of the gas source group 40 are connected to the gas supply pipe 38 via the respective valves of the valve group 42 and the respective flow rate controllers of the flow rate control group 44, respectively. The plasma processing apparatus 10 is capable of supplying the gases from one or more selected gas sources among the plurality of gas sources of the gas source group 40 to the chamber 12c at individually adjusted flow rates.

A baffle plate 48 is provided inside the chamber 12c and between the support portion 15 and the side wall 12s of the chamber body 12. The baffle plate 48 may be formed, for example, by coating ceramic such as yttrium oxide or the like on an aluminum base material. A large number of through-holes are formed in the baffle plate 48. Under the baffle plate 48, an exhaust pipe 52 is connected to the bottom of the chamber body 12. An exhaust device 50 is connected to the exhaust pipe 52. The exhaust device 50 includes a pressure controller and a vacuum pump such as a turbo molecular pump or the like. The exhaust device 50 can depressurize the chamber 12c.

The plasma processing apparatus 10 further includes a first high frequency power source 62. The first high frequency power source 62 is a power source for generating a first high frequency for plasma generation and is configured to generate a high frequency having a frequency within a range of 27 to 100 MHz, for example, a frequency of 60 MHz. The first high frequency power source 62 is connected to the upper electrode 30 via a matcher 63. The matcher 63 includes a circuit for matching an output impedance of the first high frequency power source 62 and an input impedance at a load side (the side of the upper electrode 30). The first high frequency power source 62 may be connected to the lower electrode 18 via the matcher 63. When the first high frequency power source 62 is connected to the lower electrode 18, the upper electrode 30 is connected to the ground potential.

The plasma processing apparatus 10 further includes a second high frequency power source 64. The second high frequency power source 64 is a power source for generating a bias-purpose second high frequency for pulling ions into the workpiece W. The frequency of the second high frequency is lower than the frequency of the first high frequency. The frequency of the second high frequency is a frequency falling within the range of 400 kHz to 13.56 MHz, for example, 400 kHz. The second high frequency power source 64 is connected to the lower electrode 18 via a matcher 65. The matcher 65 includes a circuit for matching an output impedance of the second high frequency power source 64 and an input impedance at a load side (the side of the lower electrode 18).

In one embodiment, the plasma processing apparatus 10 may further include a control part Cnt. The control part Cnt is a computer including a processor, a storage device, an input device, a display device and the like, and is configured to control the respective parts of the plasma processing apparatus 10. Specifically, the control part Cnt executes a control program stored in the storage device and controls the respective parts of the plasma processing apparatus 10 based on recipe data stored in the storage device. As a result, the plasma processing apparatus 10 executes a process specified by the recipe data. For example, the control part Cnt controls the respective parts of the plasma processing apparatus 10 based on the recipe data for the method MT.

During the plasma process using the plasma processing apparatus 10, the gas from the selected gas source among the plurality of gas sources of the gas source group 40 is supplied to the chamber 12c. In addition, the chamber 12c is depressurized by the exhaust device 50. Then, the gas supplied to the chamber 12c is excited by a high frequency electric field generated by the high frequency power from the first high frequency power source 62. As a result, plasma is generated inside the chamber 12c. Further, the second high frequency is supplied to the lower electrode 18. As a result, ions in the plasma are accelerated toward the workpiece W. By irradiating the workpiece with ions and/or radicals thus accelerated, the workpiece W is etched.

Figure 4A:
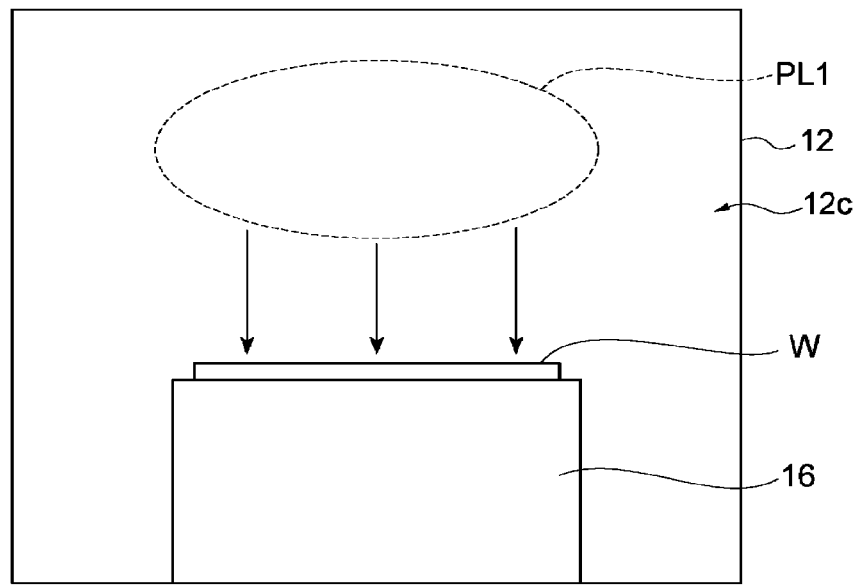
FIG. 4A is a view for explaining step ST1.
Figure 4B:
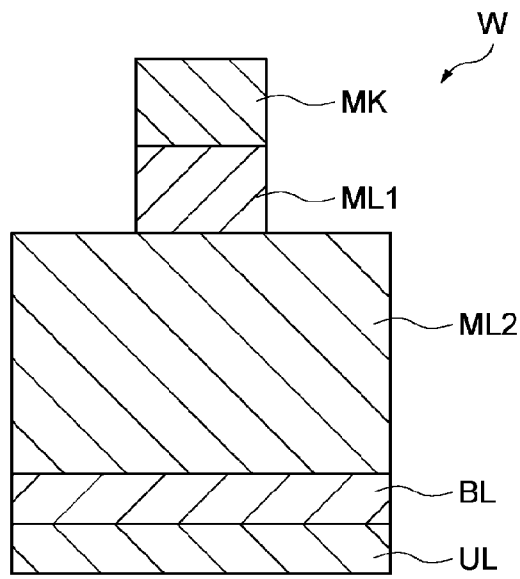
FIG. 4B is a view showing a state of a workpiece after execution of step ST1.
Figure 5A:
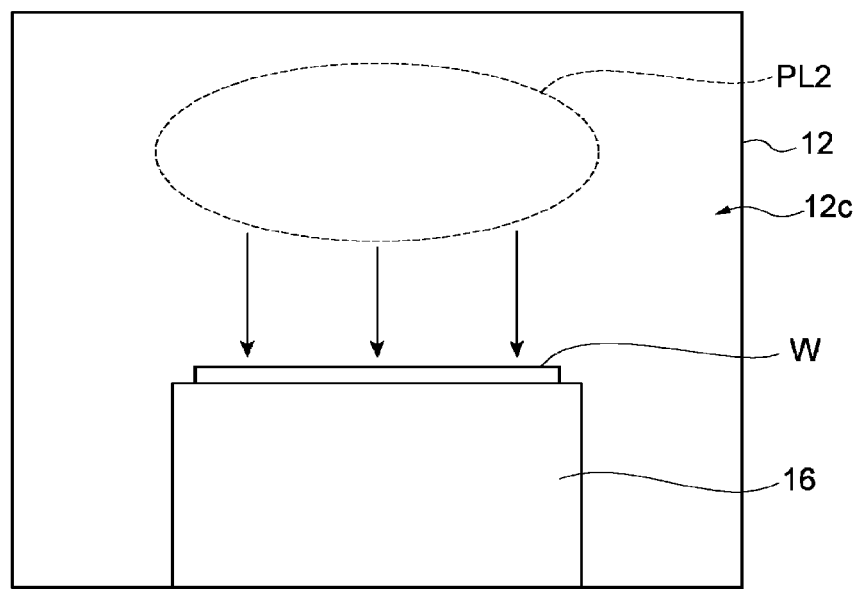
FIG. 5A is a view for explaining step ST2.
Figure 5B:
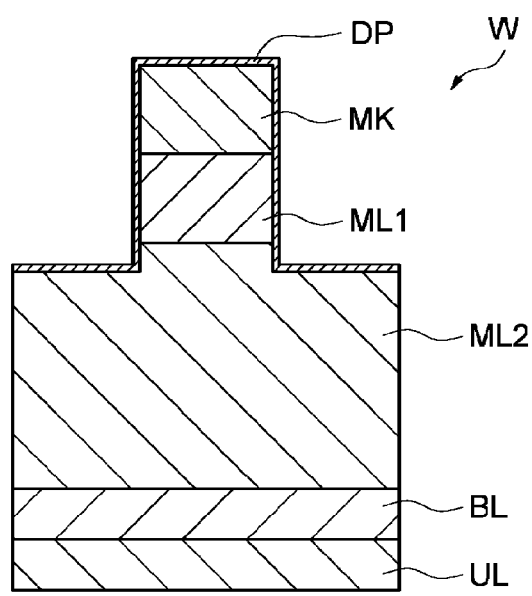
FIG. 5B is a view showing a state of a workpiece after execution of step ST2.
Figure 6A:
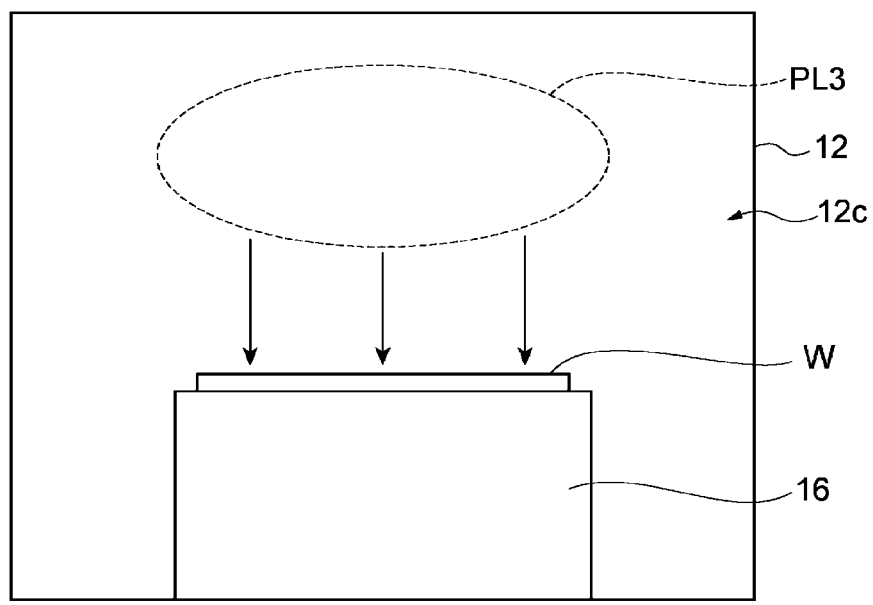
FIG. 6A is a view for explaining step ST3.
Figure 6B:
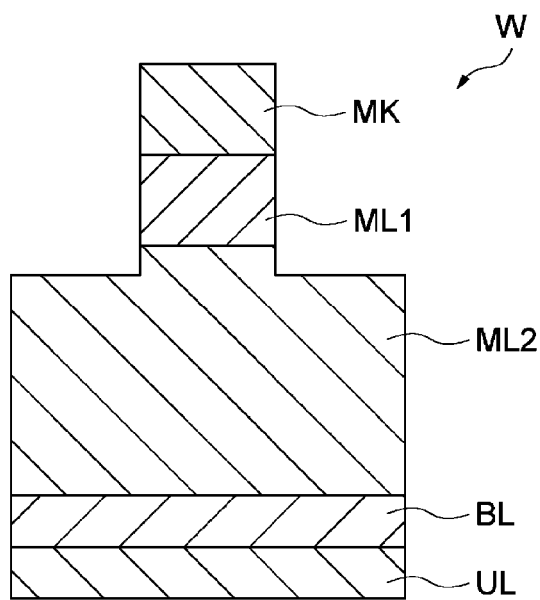
FIG. 6B is a view showing a state of a workpiece after execution of step ST3.
Figure 7:
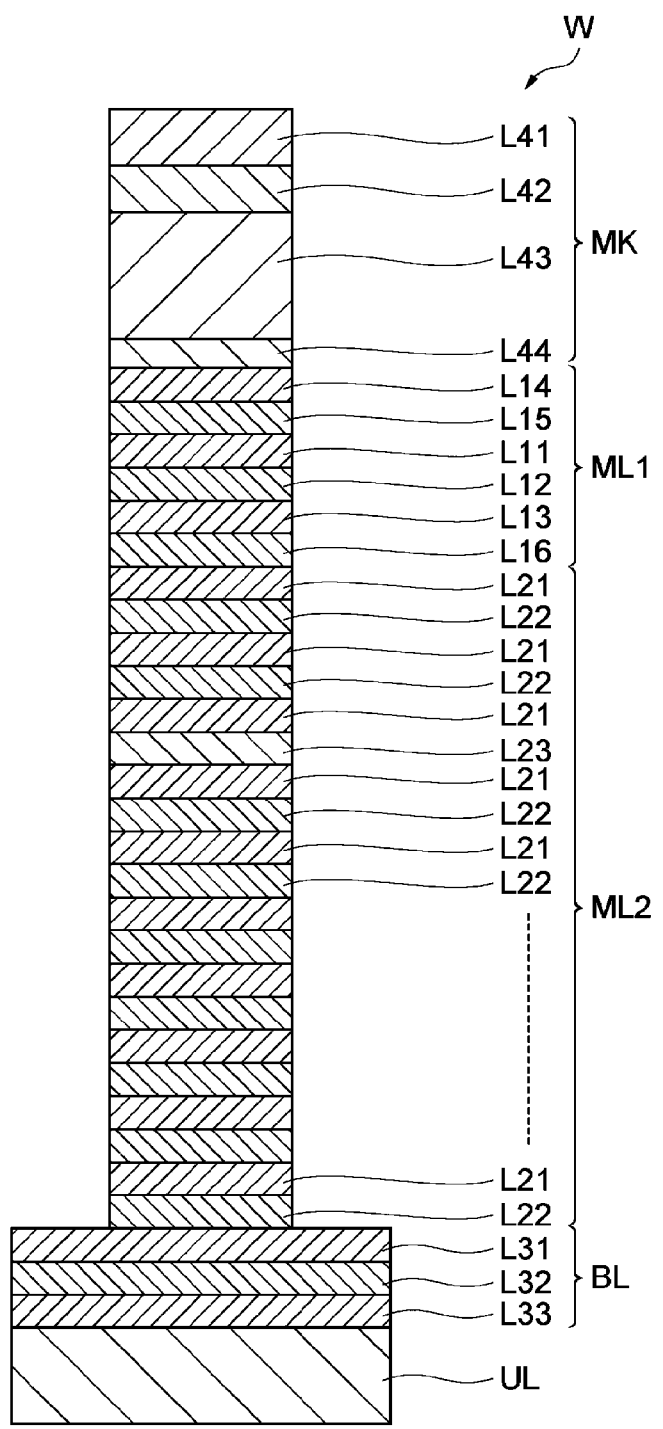
FIG. 7 is a view showing a state of a workpiece at the end of the method shown in FIG. 1.

Hereinafter, the method MT will be described in detail with reference to FIG. 1 and FIGS. 4 to 7. FIG. 4A is a view for explaining step ST1, and FIG. 4B is a view showing a state of the workpiece after execution of step ST1. FIG. 5A is a view for explaining step ST2, and FIG. 5B is a view showing a state of the workpiece after execution of step ST2. FIG. 6A is a view for explaining step ST3, and FIG. 6B is a view showing a state of the workpiece after execution of step ST3. FIG. 7 is a view showing a state of the workpiece at the end of the method shown in FIG. 1. In the following description, the method MT will be described by taking, as an example, a case where the method MT is applied to the workpiece W shown in FIG. 2 by using the plasma processing apparatus 10.

In the method MT, the workpiece W is mounted on the electrostatic chuck 20 of the stage 16 and is held by the electrostatic chuck 20. Then, steps ST1, ST2 and ST3 described below are executed.

In step ST1, the multilayer film ML1 is etched. In step ST1 of one embodiment, the plasma of only a noble gas is generated inside the chamber 12c. In step ST1, for example, the plasma PL1 of a Kr gas is generated. In step ST1, the noble gas is supplied from the gas source group 40 to the chamber 12c. Further, an internal pressure of the chamber 12c is set to a specified pressure by the exhaust device 50. In addition, a first high frequency is supplied from the first high frequency power source 62 for plasma generation. As a result, as shown in FIG. 4A, the plasma PL1 of only the noble gas is generated inside the chamber 12c. In step ST1 of one embodiment, a second high frequency is supplied from the second high frequency power source 64 to the lower electrode 18. As a result, ions (ions of noble gas atoms) from the plasma PL1 are drawn toward the workpiece W and collide with the workpiece W. That is to say, in step ST1 of one embodiment, the etching of the multilayer film ML1 is performed by the sputtering of the noble gas. By the execution of this step ST1, the multilayer film ML1 is etched in the portion exposed from the mask MK. As a result, as shown in FIG. 4B, a pattern of the mask MK is transferred to the multilayer film ML1.

The multilayer film ML1 may be etched by executing, once or more, a sequence including step ST2 and step ST3 to be described later. Furthermore, an arbitrary plasma etching process may be used in the step ST1 as long as the multilayer film ML1 can be etched.

In one embodiment, step ST2 is then executed. In step ST2, in order to etch the multilayer film ML2, the plasma of a first gas containing a hydrocarbon gas and a noble gas is generated inside the chamber 12c. The hydrocarbon gas is, for example, a methane gas. The noble gas is, for example, a Kr gas. In step ST2, the first gas is supplied from the gas source group 40 to the chamber 12c. Furthermore, the internal pressure of the chamber 12c is set to a specified pressure by the exhaust device 50. Moreover, in step ST2, a first high frequency is supplied from the first high frequency power source 62 to generate plasma. As a result, a plasma PL2 of the first gas is generated inside the chamber 12c as shown in FIG. 5A. In step ST2 of one embodiment, a second high frequency is supplied from the second high frequency power source 64 to the lower electrode 18.

In step ST2, the workpiece W is irradiated with ions and/or radicals generated from the plasma PL2. The multilayer film ML2 is modified by ions and/or radicals of hydrocarbon, carbon and hydrogen, and can be easily etched. In step ST2, the multilayer film ML2 is etched by the sputtering of the ions from the plasma PL2. Furthermore, in step ST2, a deposit DP containing carbon is formed on the workpiece W (see FIG. 5B).

In the subsequent step ST3, in order to remove the deposit DP, the plasma of a second gas is generated inside the chamber 12c. The second gas includes a gas containing carbon and oxygen, an oxygen ($O_2$) gas and a noble gas. The second gas does not contain hydrogen. The gas containing carbon and oxygen is, for example, a carbon monoxide gas and/or a carbon dioxide gas. The noble gas is, for example, a Ne gas. In step ST3, the second gas is supplied from the gas source group 40 to the chamber 12c. Further, the internal pressure of the chamber 12c is set to a specified pressure by the exhaust device 50. In step ST3, a first high frequency is supplied from the first high frequency power source 62 to generate plasma. As a result, a plasma PL3 of the second gas is generated inside the chamber 12c as shown in FIG. 6A. In step ST3 of one embodiment, a second high frequency is supplied from the second high frequency power source 64 to the lower electrode 18.

In step ST3, ions and/or radicals generated from the plasma PL3 are irradiated onto the workpiece W. In step ST3, the deposit DP is removed by oxygen ions and/or radicals generated from the plasma PL3 (see FIG. 6B).

In the subsequent step STJ, it is determined whether or not a stop condition is satisfied. The stop condition is satisfied when the number of executions of the sequence including step ST2 and step ST3 has reached a predetermined number. If it is determined that the stop condition is not satisfied in step STJ, the sequence including step ST2 and step ST3 is executed again. That is to say, steps ST2 and ST3 are alternately repeated. On the other hand, if it is determined that the stop condition is satisfied in step STJ, the execution of the method MT is terminated. Upon completion of the method MT, the pattern of the mask MK is transferred to the multilayer film ML1 and the multilayer film ML2, and a pillar including the multilayer film ML1 and the multilayer film ML2 is formed as shown in FIG. 7. In one embodiment, a plurality of pillars may be formed simultaneously on the workpiece W. The number of executions of the sequence including step ST1 and step ST2 may be once.

As described above, the second gas used in step ST3 of the method MT does not contain hydrogen. When the deposit DP is removed by generating the plasma of a gas containing hydrogen, the magnetic characteristics of the magneto-resistive effect element deteriorate. This is presumably because hydrogen ions and/or radicals alter the multilayer film of the magneto-resistive effect element. On the other hand, in step ST3 of the method MT, the removal of the deposit DP is performed by generating the plasma of the second gas not containing hydrogen. Therefore, the deterioration of the magnetic characteristics of the magneto-resistive effect element is suppressed. In the second gas, the oxygen gas is diluted with the gas containing carbon and oxygen and the noble gas. Thus, the excessive oxidation of the workpiece W is suppressed.

Furthermore, in step ST1 of one embodiment, the plasma of only the noble gas is generated to etch the multilayer film ML1. When the multilayer film ML1 is etched by the sputtering of only noble gas ions, the deterioration of the magnetic characteristics of the magneto-resistive effect element is further suppressed.

While various embodiments have been described above, the present disclosure is not limited to the above-described embodiments. Various modifications may be made. For example, in the workpiece shown in FIG. 2, the multilayer film ML1 has been described to be formed between the mask MK and the multilayer film ML2. However, the multilayer film ML2 may be formed between the mask MK and the multilayer film ML1. In the case where the multilayer film ML2 is formed between the mask MK and the multilayer film ML1, step ST2 and step ST3 are executed before step ST1.

Furthermore, when executing the method MT and the method according to the modification thereof, it is possible to use a plasma processing apparatus other than the capacitively coupled plasma processing apparatus. Examples of such a plasma processing apparatus include an inductively coupled plasma processing apparatus and a plasma processing apparatus using surface waves such as microwaves or the like to generate plasma.

Hereinafter, various experiments conducted for evaluating the method MT will be described. It should be noted that the present disclosure is not limited by the experiments described below.

(First Experiment)

In the first experiment, the method MT was applied to the workpiece having the structure shown in FIG. 2 using the plasma processing apparatus 10 having the structure shown in FIG. 3, thereby preparing a plurality of experiment samples 1 having the structure of the magneto-resistive effect element shown in FIG. 7. The processing conditions of the method MT used in the preparation of experiment samples 1 are shown below.

<Processing Conditions of Method MT in Preparation of Experiment Samples 1>

Step ST1
Pressure of chamber: 30 [mTorr] (4 [Pa])
Flow rate of Kr gas: 200 [sccm]

First high frequency: 60 [MHz] and 200 [W]
Second high frequency: 400 [kHz] and 800 [W]
Processing time: 6 [sec]
Step ST2
Pressure of chamber: 10 [mTorr] (1.333 [Pa])
Flow rate of Kr gas in first gas: 170 [sccm]
Flow rate of methane gas in first gas: 30 [sccm]
First high frequency: 60 [MHz] and 200 [W]
Second high frequency: 400 [kHz] and 800 [W]
Processing time: 5 [sec]
Step ST3
Pressure of chamber: 10 [mTorr] (1.333 [Pa])
Flow rate of oxygen ($O_2$) gas in second gas: 10 [sccm]
Flow rate of carbon monoxide gas in second gas: 140 [sccm]
Flow rate of Ne gas in second gas: 50 [sccm]
First high frequency: 60 [MHz] and 200 [W]
Second high frequency: 400 [kHz] and 800 [W]
Processing time: 5 [sec]
Number of repetitions of step ST2 and step ST3: 25 times Furthermore, in the first experiment, for comparison, the workpiece having the structure shown in FIG. 2 was etched using the plasma processing apparatus 10 having the structure shown in FIG. 3, thereby preparing a plurality of comparative samples 1 having the structure of the magneto-resistive effect element shown in FIG. 7. In the preparation of comparative samples 1, the multilayer film ML1 was etched in a first step. Then, a second step and a third step were alternately repeated to etch the multilayer film ML2. Processing conditions of the first to third steps are shown below.

Figure 8A:
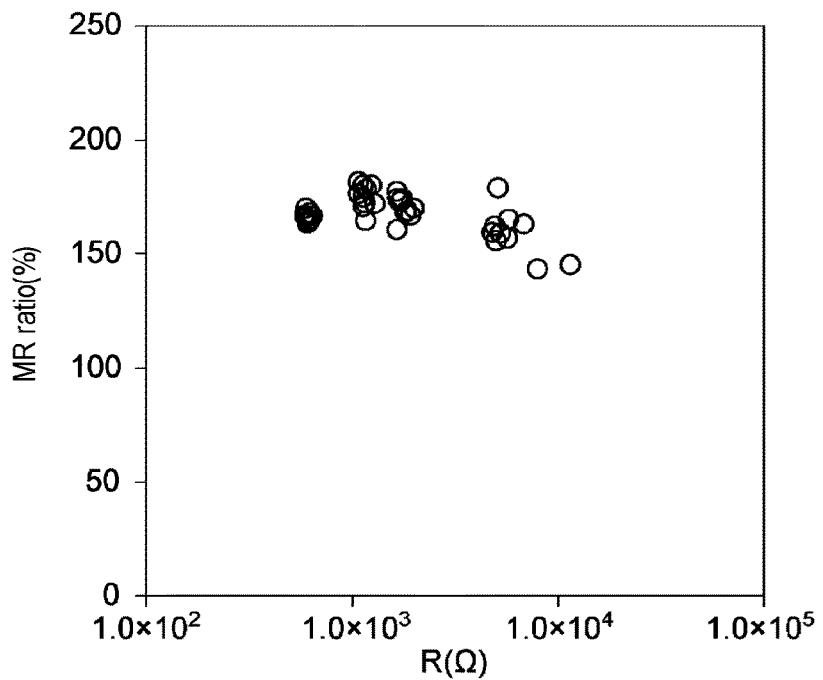
FIG. 8A is a graph showing a resistance value R and an MR ratio of experiment sample 1.
Figure 8B:
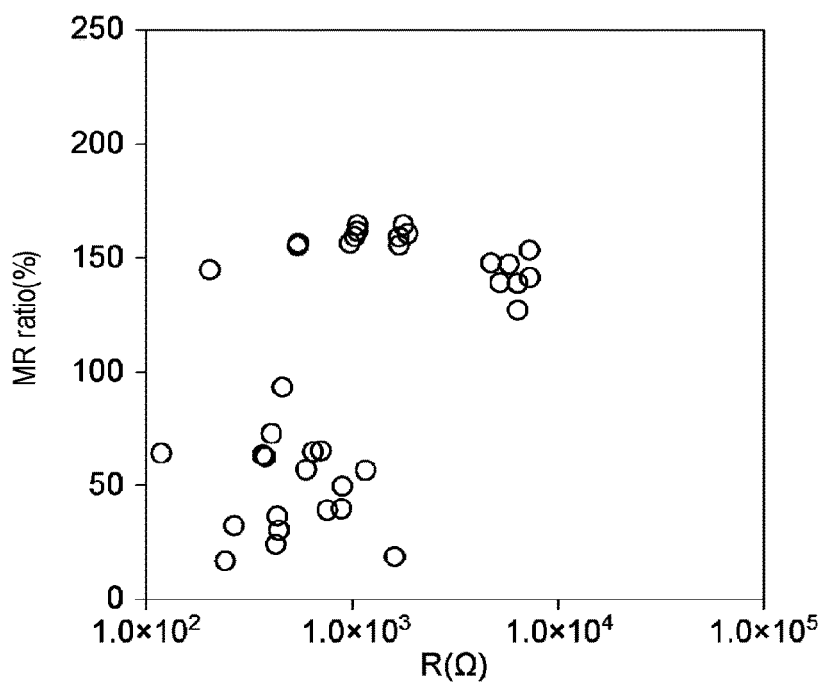
FIG. 8B is a graph showing a resistance value R and an MR ratio of comparative sample 1.

<Processing Conditions of First to Third Steps in Preparation of Comparative Samples 1>
First Step
Pressure of chamber: 30 [mTorr] (4 [Pa])
Flow rate of Kr gas: 200 [sccm]
First high frequency: 60 [MHz] and 200 [W]
Second high frequency: 400 [kHz] and 800 [W]
Processing time: 6 [sec]
Second Step
Pressure of chamber: 10 [mTorr] (1.333 [Pa])
Flow rate of Kr gas: 170 [sccm]
Flow rate of methane gas: 30 [sccm]
First high frequency: 60 [MHz] and 200 [W]
Second high frequency: 400 [kHz] and 800 [W]
Processing time: 5 [sec]
Third Step
Pressure of chamber: 10 [mTorr] (1.333 [Pa])
Flow rate of hydrogen ($H_2$) gas: 100 [sccm]
Flow rate of nitrogen ($N_2$) gas: 50 [sccm]
Flow rate of Ne gas: 50 [sccm]
First high frequency: 60 [MHz] and 200 [W]
Second high frequency: 400 [kHz] and 800 [W]
Processing time: 5 [sec]
Number of repetitions of second step and third step: 25 times Subsequently, the resistance value R and the MR ratio of each of experiment samples 1 and each of comparative samples 1 thus prepared were measured. FIG. 8A shows the resistance value R and the MR ratio of experiment samples 1, and FIG. 8B shows the resistance value R and the MR ratio of comparative samples 1. In the graphs of FIGS. 8A and 8B, the horizontal axis represents the resistance value R and the vertical axis represents the MR ratio. As shown in FIG. 8B, comparative samples 1 contain many samples having a low resistance value and a low MR ratio. That is to say, when preparing a plurality of comparative samples 1, samples in which the magnetic characteristics are largely deteriorated were obtained. On the other hand, as shown in FIG. 8A, the resistance value and the MR ratio of experiment samples 1 were high. The difference in resistance value of experiment samples 1 is attributable to the difference in pillar width (CD value) of the magneto-resistive effect element. From the above results, it was confirmed that the deterioration of the magnetic characteristics of the magneto-resistive effect element is suppressed by the etching of the method MT.

(Second Experiment)

In the second experiment, a plurality of experiment samples 2 was prepared in the same manner as in experiment samples 1 described above. Furthermore, a plurality of experiment samples 3 was prepared from the workpiece having the structure shown in FIG. 2 by using the plasma processing apparatus 10 having the structure shown in FIG. 3. When preparing experiment samples 3, the multilayer film ML1 and the multilayer film ML2 were etched merely by alternately repeating steps ST2 and ST3. The processing conditions of step ST2 and the processing conditions of step ST3 in the preparation of experiment samples 3 were the same as the processing conditions of step ST2 and the processing conditions of step ST3 in the preparation of experiment samples 2, respectively.

For comparison, a plurality of comparative samples 2 was prepared in the same manner as in comparative samples 1 described above. Furthermore, a plurality of comparative samples 3 was prepared from the workpiece having the structure shown in FIG. 2 using the plasma processing apparatus 10 having the structure shown in FIG. 3. When preparing comparative samples 3, the multilayer film ML1 and the multilayer film ML2 were etched merely by alternately repeating the second step and the third step described above in connection with the preparation of comparative samples 1. The processing conditions of the second step and the processing conditions of the third step in the preparation of comparative samples 3 were the same as the processing conditions of the second step and the processing conditions of the third step in the preparation of comparative samples 2, respectively.

Figure 9:
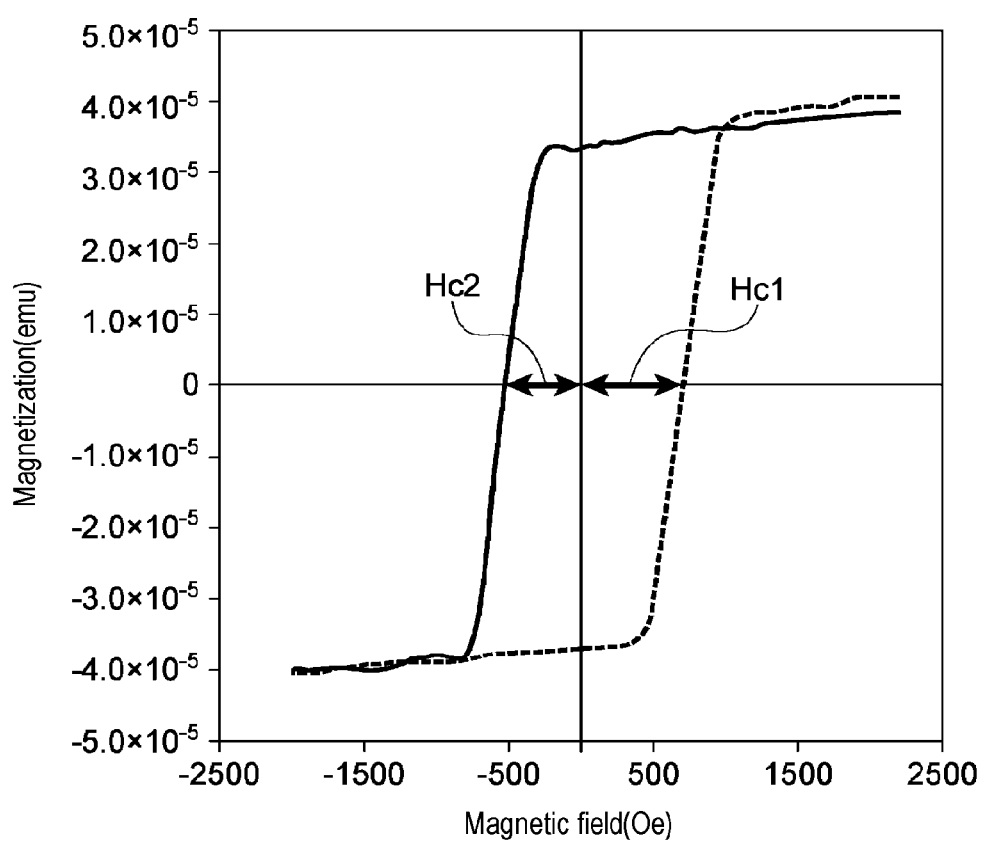
FIG. 9 is a view for explaining a coercive force.
Figure 10:
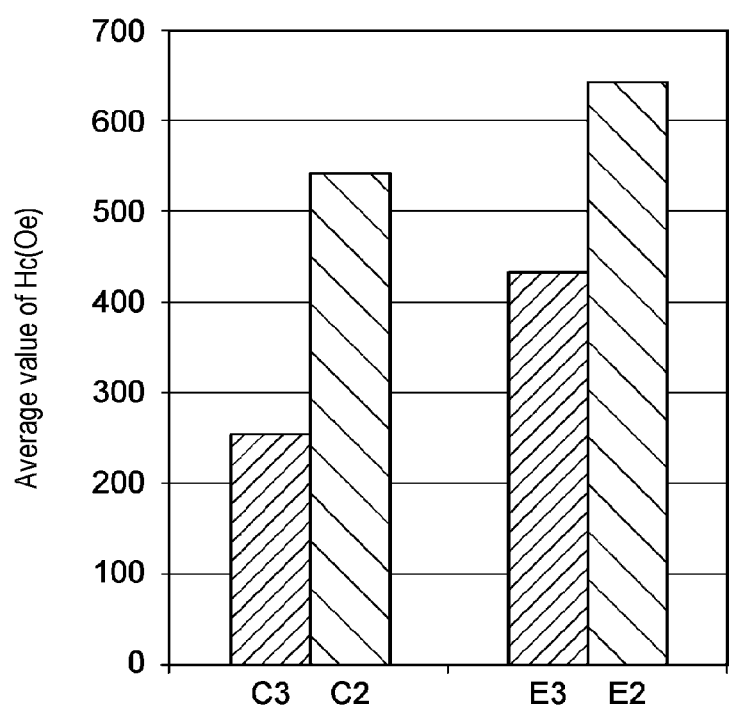
FIG. 10 is a graph showing the results of a second experiment.

Then, the coercive force Hc of each of the plurality of experiment samples 2, the plurality of experiment samples 3, the plurality of comparative samples 2 and the plurality of comparative samples 3 was measured. When measuring the coercive force Hc of each sample, as shown in FIG. 9, magnetization curves were prepared using a sample vibration type magnetometer and the magnetic field intensities Hc1 and Hc2 were measured. Then, the average value of Hc1 and Hc2 was obtained as the coercive force Hc. The average value of the coercive force Hc of the plurality of experiment samples 2, the average value of the coercive force Hc of the plurality of experiment samples 3, the average value of the coercive forces Hc of the plurality of comparative samples 2 and the average value of the coercive forces Hc of the plurality of comparative samples 3 were obtained. FIG. 10 shows the results. In the graph of FIG. 10, E2, E3, C2 and C3 represent the average value of the coercive force Hc of the plurality of experiment samples 2, the average value of the coercive force Hc of the plurality of experiment samples 3, the average value of the coercive force Hc of the plurality of comparative samples 2 and the average value of the coercive force Hc of the plurality of comparative samples 3, respectively. As can be seen from FIG. 10, the average value (E3) of the coercive force Hc of the plurality of experiment samples 3 was considerably larger than the average value (C3) of the coercive force Hc of the plurality of comparative samples 3. Therefore, it was confirmed that the deterioration of the magnetic characteristics of the magneto-resistive effect element can be suppressed by using a hydrogen-free gas as the second gas at the time of executing step ST3. Furthermore, as can be seen from FIG. 10, the average value (E2) of the coercive force Hc of the plurality of experiment samples 2 was considerably larger than the average value (E3) of the coercive force Hc of the plurality of experiment samples 3. Therefore, it was confirmed that the deterioration of the magnetic characteristics of the magneto-resistive effect element can be further suppressed by using the plasma of only the noble gas in the etching of the multilayer film ML1.

According to the present disclosure in some embodiments, it is possible to provide an etching method capable of suppressing deterioration of magnetic characteristics of a magneto-resistive effect element.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method of a workpiece executed in manufacturing a magneto-resistive effect element,
    wherein the workpiece includes a first multilayer film and a second multilayer film laminated with the first multilayer film, the first multilayer film includes a first magnetic layer, a second magnetic layer and a tunnel barrier layer formed between the first magnetic layer and the second magnetic layer, and the second multilayer film is a multilayer film constituting a pinning layer in the magneto-resistive effect element, and
    wherein the etching method comprises:
    etching the first multilayer film;
    generating a plasma of a first gas including a hydrocarbon gas and a noble gas inside a chamber of a plasma processing apparatus to etch the second multilayer film inside the chamber of the plasma processing apparatus; and
    generating a plasma of a second gas including a gas containing carbon and oxygen, an oxygen gas and a noble gas and not containing hydrogen inside the chamber to remove a carbon-containing deposit formed on the workpiece in the generating a plasma of a first gas.

2. The method of claim 1, wherein the second gas includes a carbon monoxide gas or a carbon dioxide gas as the gas containing carbon and oxygen.

3. The method of claim 1, wherein the first gas includes a methane gas as the hydrocarbon gas.

4. The method of claim 1, wherein the generating a plasma of a first gas includes: supplying a high frequency to a lower electrode of a stage, on which the workpiece is mounted; and causing ions from the plasma of the first gas to collide with the second multilayer film to etch the second multilayer film.

5. The method of claim 4, wherein the generating a plasma of a second gas includes supplying the high frequency to the lower electrode.

6. The method of claim 1, wherein the etching the first multilayer film includes generating a plasma of only the noble gas inside the chamber to etch the first multilayer film inside the chamber.

7. The method of claim 6, wherein the etching the first multilayer film includes: supplying a high frequency to a lower electrode of a stage, on which the workpiece is mounted; and causing ions from the plasma of only the noble gas to collide with the first multilayer film to etch the first multilayer film.

8. The method of claim 1, further comprising: alternately repeating the generating a plasma of a first gas and the generating a plasma of a second gas.

9. The method of claim 1, wherein the second multilayer film includes a cobalt layer and a platinum layer.

10. The method of claim 1, wherein the first magnetic layer and the second magnetic layer are CoFeB layers and the tunnel barrier layer is an MgO layer.

* * * * *